(12) United States Patent
Das et al.

(10) Patent No.: US 7,022,378 B2
(45) Date of Patent: *Apr. 4, 2006

(54) NITROGEN PASSIVATION OF INTERFACE STATES IN SIO₂/SIC STRUCTURES

(75) Inventors: Mrinal Kanti Das, Durham, NC (US); Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 18 days.

This patent is subject to a terminal disclaimer.

(21) Appl. No.: 10/640,934

(22) Filed: Aug. 14, 2003

(65) Prior Publication Data

US 2004/0101625 A1    May 27, 2004

Related U.S. Application Data (60) Provisional application No. 60/406,753, filed on Aug. 30, 2002.

(51) Int. Cl.
*C23C 16/40* (2006.01)

(52) U.S. Cl. .......................... 427/255.29; 427/255.394; 427/397.7; 438/787

(58) Field of Classification Search .......... 427/255.29, 427/255.394, 397.7; 438/787
See application file for complete search history.

(56) References Cited

U.S. PATENT DOCUMENTS

| | | | |
|---|---|---|---|
| 3,924,024 A | 12/1975 | Naber et al. | 427/95 |
| 4,466,172 A | 8/1984 | Batra | 29/571 |
| 4,875,083 A | 10/1989 | Palmour | 357/23.6 |
| 5,170,231 A | 12/1992 | Fujii et al. | 357/23.2 |
| 5,170,455 A | 12/1992 | Goossen et al. | 385/89 |
| 5,184,199 A | 2/1993 | Fujii et al. | 29/10 |
| 5,479,316 A | 12/1995 | Smrtic et al. | 361/322 |
| 5,506,421 A | 4/1996 | Palmour | 257/77 |
| 5,510,630 A | 4/1996 | Agarwal et al. | 257/77 |
| 5,587,870 A | 12/1996 | Anderson et al. | 361/313 |
| 5,726,463 A | 3/1998 | Brown et al. | 257/77 |
| 5,739,564 A | 4/1998 | Kosa et al. | 257/298 |

(Continued)

FOREIGN PATENT DOCUMENTS

DE    198 09 554    9/1998

(Continued)

OTHER PUBLICATIONS

Chung et al., Applied Physics Letters, vol. 77, No. 22, Nov. 27, 2000, pp. 3601-3603.*

(Continued)

*Primary Examiner*—Bret Chen
(74) *Attorney, Agent, or Firm*—Myers Bigel Sibley & Sajovec, P.A.

(57) ABSTRACT

A nitrided oxide layer on a silicon carbide layer is processed by annealing the nitrided oxide layer in a substantially oxygen-free nitrogen containing ambient. The anneal may be carried out at a temperature of greater than about 900° C., for example, a temperature of about 1100° C., a temperature of about 1200° C. or a temperature of about 1300° C. Annealing the nitrided oxide layer may be carried out at a pressure of less than about 1 atmosphere, for example, at a pressure of from about 0.01 to about 1 atm or, in particular, at a pressure of about 0.2 atm. The nitrided oxide layer may be an oxide layer that is grown in a $N_2O$ and/or NO containing ambient, that is annealed in a $N_2O$ and/or NO containing ambient or that is grown and annealed in a $N_2O$ and/or NO containing ambient.

6 Claims, 8 Drawing Sheets

U.S. PATENT DOCUMENTS

| | | | |
|---|---|---|---|
| 5,763,905 A | 6/1998 | Harris | 257/77 |
| 5,837,572 A | 11/1998 | Gardner et al. | 438/199 |
| 5,877,045 A | 3/1999 | Kapoor | 438/151 |
| 5,885,870 A | 3/1999 | Maiti et al. | 438/261 |
| 5,939,763 A | 8/1999 | Hao et al. | 257/411 |
| 5,960,289 A | 9/1999 | Tsui et al. | 438/257 |
| 5,972,801 A | 10/1999 | Lipkin et al. | 438/770 |
| 6,025,608 A | 2/2000 | Harris et al. | 257/77 |
| 6,028,012 A | 2/2000 | Wang | 438/779 |
| 6,048,766 A | 4/2000 | Gardner et al. | 438/257 |
| 6,054,352 A | 4/2000 | Ueno | 438/268 |
| 6,063,698 A | 5/2000 | Tseng et al. | 438/585 |
| 6,096,607 A | 8/2000 | Ueno | 438/522 |
| 6,100,169 A | 8/2000 | Suvorov et al. | 438/519 |
| 6,107,142 A | 8/2000 | Suvorov et al. | 438/285 |
| 6,117,735 A | 9/2000 | Ueno | 438/268 |
| 6,136,728 A | 10/2000 | Wang | 438/773 |
| 6,165,822 A | 12/2000 | Okuno et al. | 438/142 |
| 6,190,973 B1 | 2/2001 | Berg et al. | 438/275 |
| 6,204,203 B1 | 3/2001 | Narwankar et al. | 438/785 |
| 6,211,035 B1 | 4/2001 | Moise et al. | 438/396 |
| 6,221,700 B1 | 4/2001 | Okuno et al. | 438/151 |
| 6,228,720 B1 | 5/2001 | Kitabatake et al. | 438/268 |
| 6,238,967 B1 | 5/2001 | Shiho et al. | 438/244 |
| 6,239,463 B1 | 5/2001 | Williams et al. | 257/328 |
| 6,246,076 B1 | 6/2001 | Lipkin et al. | 257/328 |
| 6,297,172 B1 | 10/2001 | Kashiwagi | 438/773 |
| 6,316,791 B1 | 11/2001 | Schorner et al. | 257/77 |
| 6,342,748 B1 * | 1/2002 | Nakamura et al. | 310/313 A |
| 6,344,663 B1 | 2/2002 | Slater, Jr. et al. | 257/77 |
| 6,455,892 B1 | 9/2002 | Okuno et al. | 257/328 |
| 6,593,620 B1 | 7/2003 | Hshieh et al. | 257/335 |
| 6,610,366 B1 * | 8/2003 | Lipkin | 427/378 |
| 6,767,843 B1 * | 7/2004 | Lipkin et al. | 438/758 |
| 2001/0055852 A1 | 12/2001 | Moise et al. | 438/396 |
| 2002/0030191 A1 | 3/2002 | Das et al. | 257/77 |
| 2002/0038891 A1 | 4/2002 | Ryu et al. | 257/350 |
| 2002/0072247 A1 | 6/2002 | Lipkin et al. | 438/767 |
| 2002/0102358 A1 | 8/2002 | Das et al. | 472/376.2 |
| 2004/0101625 A1 | 5/2004 | Das et al. | 427/378 |

FOREIGN PATENT DOCUMENTS

| | | |
|---|---|---|
| DE | 19900171 | 12/2000 |
| DE | 10036208 | 2/2002 |
| EP | 0 637 069 A1 | 2/1995 |
| EP | 0 637 069 B1 | 1/2001 |
| JP | 03157974 | 7/1991 |
| JP | 08264766 | 10/1996 |
| JP | 09205202 | 8/1997 |
| JP | 11191559 | 7/1999 |
| JP | 11238742 | 8/1999 |
| JP | 11261061 | 9/1999 |
| JP | 11266017 | 9/1999 |
| JP | 11274487 | 10/1999 |
| JP | 2000049167 | 2/2000 |
| JP | 2000082812 | 3/2000 |
| JP | 2000-252461 A | 9/2000 |
| JP | 02000252461 A | 9/2000 |
| JP | 2000106371 | 4/2001 |
| WO | WO 97/17730 | 5/1997 |
| WO | WO 97/39485 | 10/1997 |
| WO | WO 98/02924 | 1/1999 |
| WO | WO 99/63591 | 12/1999 |
| WO | WO 00/13236 | 3/2002 |
| WO | WO02/084727 A2 | 10/2002 |

OTHER PUBLICATIONS

Xu et al. IEEE Electron Device Letters, vol. 21, No. 6, Jun. 2000, pp. 298-300.*

Wang et al. "The Efects of $NH_3$ Plasma Passivation on Ploysilicon Thin-film Transistors," *IEEE Electron Devices*. vol. 16, No. 11, Nov. 1995.

International Search Report issued Apr. 14, 2004 for PCT/US03/26605.

Agarwal et al. "1.1 kV 4H-SiC Power UMOSFET's," *IEEE Electron Device Letters*, vol. 18, No. 12, Dec. 1997, pp. 586-588.

Agarwal et al. "1400 V 4H-SiC Power MOSFET's," *Materials Science Forum* vols. 264-268, pp. 989-992, 1998.

Agarwal et al. "Investigation of Lateral RESURF, 6H-SiC MOSFETs," *Materials Science Forum*, vols. 338-342, (2000) pp. 1307-1310.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Casady et al. "900 V DMOS and 1100 V UMOS 4H-SiC Power FETs," *IEEE Device Research Conference*, Ft. Collins, CO Jun. 23-25, 1997.

Schörner et al. "Rugged Power MOSFETs in 6H-SiC with Blocking Capability up to 1800 V," *Materials Science Forum*, vols. 338-342, (2000) pp. 1295-1298.

Shenoy et al. "High-Voltage Double-Implanted Power MOSFET's in 6H-SiC," *IEEE Electron Device Letters*, vol. 18, No. 3, Mar. 1997, pp. 93-95.

Shenoy et al. "The Planar 6H-SiC ACCUFET: A New High-Voltage Power MOSFET Structure," *IEEE Electron Device Letters*, vol. 18, No. 12, pp. 589-591, Dec. 1997.

Singh et al. "High Temperature, High Current, 4H-SiC Accu-DMOSFET," *Materials Science Forum* vols. 338-342, (2000) pp. 1271-1274.

Suvorov et al. "4H-SiC Self-Aligned Implant-Diffused Structure for Power DMOSFETs," *Materials Science Forum*, vols. 338-342 (2000), pp. 1275-1278.

Tan et al. "High-Voltage Accumulation-Layer UMOSFETs in 4H-SiC," *IEEE Electron Device Letters*, vol. 19, No. 12, Dec. 1998, pp. 487-489.

Vathulya et al. "Characterization of Channel Mobility on Implanted SiC to Determine Polytype Suitability for the Power DIMOS Structure," *Electronic Materials Conference*, Santa Barbara, CA, Jun. 30-Jul. 2, 1999.

Wang et al. "Accumulation-Mode SiC Power MOSFET Design Issues," *Materials Science Forum*, vols. 338-342, pp. 1287-1290.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

Xu et al. "Improved Performance and Reliability of $N_2O$-Grown Oxynitride on 6H-SiH," *IEEE Electron Device Letters*, vol. 21, No. 6, Jun. 2000, p. 298-300.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSFETs Following High Temperature Anneals in Nitric Oxide," *IEEE Electron Device Letters*, vol. 22, No. 4, Apr. 2001.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

L.A. Lipkin and J.W. Palmour, "Low interface state density oxides on p-type SiC," Materials Science Forum vols. 264-268, pp. 853-856, 1998.

Baliga, Power Semiconductor Devices, Chapter 7, PWS Publishing, 1996.

U.S. Provisional Appl. No. 60/435,212.

U.S. Provisional Appl. No. 60/294,307.

U.S. Appl. No. 10/422,130.

Chakraborty et al. "Interface Properties of $N_2O$-annealed $SiO_2$/SiC system," *Proceedings IEEE Hong Kong Electron Devices Meeting.* Jun. 24, 2000, pp. 108-111.

Lipkin et al. "Insulator Investigation on SiC for Improved Reliability," *IEEE Transactions on Electron Devices.* vol. 46, No. 3, Mar. 1999, pp. 525-532.

Mutin, P. Herbert, "Control of the Composition and Structure of Silicon Oxycarbide and Oxynitride Glasses Derived from Polysiloxane Precursors," *Journal of Sol-Gel Science and Technology.* vol. 14 (1999) pp. 27-38.

del Prado et al. "Full Composition Range Silicon Oxynitride Films Deposited by ECR-PECVD at Room Temperatures," *Thin Solid Films.* vol. 343-344 (1999) p. 437-440.

Wang et al. "High Temperature Characteristics of High-Quality SiC MIS Capacitors with O/N/O Gate Dielectric," *IEEE Transactions on Electron Devices.* vol. 47, No. 2, Feb. 2000.

Lai et al. "Interface Properties of $N_2O$-Annealed $NH_3$-Treated 6H-SiC MOS Capacitor," *Electron Devices Meeting*, Jun. 26, 1999, pp. 46-49.

Lipkin et al. "Challenges and State-of-the-Art of Oxides on SiC," *Mat. Res. Symp. Proc.* vol. 640, 2001.

Cho et al. "Improvement of charge trapping by hydrogen post-oxidation annealing in gate oxide of 4H-SiC methel-oxide-semiconductor capacitors," *Applied Physics Letters.* vol. 77, No. 8, pp. 1215-1217.

Fukuda et al. "Improvement of $SiO_2$/4H-SiC Interface Using High-Temperature Hydrogen Annealing at Low Pressure and Vacuum Annealing," *Jpn J. Appl. Phys.* vol. 38, Apr. 1999, pp. 2306-2309.

Suzuki et al. "Effect of Post-oxidation-annealing in Hydrogen on $SiO_2$/4H-SiC Interface," *Materials Science Forum*, vols. 338-342 (2000) 1073-1076.

Leonhard et al. "Long term stability of gate-oxides on n- and p-type silicon carbide studied by charge injection techniques," *Materials Science Engineering*, vol. 46, No. 1-3, Apr. 1997, pp. 263-266.

Fukuda et al. "Improvement of $SiO_2$/4H-SiC Interface by Using High Temperature Hydrogen Annealing at 1000°C," *Extended Abstracts of the International Conference on Solid State Devices and Materials*, Japan Society of Applied Physcis, Tokyo, Japan, Sep. 1998.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc.* vol. 640, 2001.

P.T. Lai, Supratic Chakraborty, C.L. Chan, and Y.C. Cheng, "Effects of nitridation and annealing on interface properties of thermally oxidized $SiO_2$/SiC metal-oxide-semiconductor system," *Applied Physics Letters*, vol. 76, No. 25, pp. 3744-3746, Jun. 2000.

R. Schorner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

V.V. Afanasev, M. Bassler, G. Pensl, and M. Schulz, "Intrinsic SiC/$SiO_2$ Interface States," *Phy. Stat. Sol. (a)*, vol. 162, pp. 321-337, 1997.

S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.

M.A. Capano, S.Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

D. Alok, E. Arnold, and R. Egloff, "Process Dependence of Inversion Layer Mobility in 4H-SiC Devices," *Materials Science Forum*, vols. 338-342, pp. 1077-1080, 2000.

K. Ueno and Tadaaki Oikawa, "Counter-Doped MOSFET's of 4H-SiC." *IEEE Electron Device Letters*, vol. 20, No. 12, pp. 624-626, Dec. 1999.

V. R. Vathulya, H. Shang, and M. H. White, "A Novel 6H-SiC Power DMOSFET with Implanted P-Well Spacer." *IEEE Electron Device Letters*, vol. 20, No. 7, Jul. 1999, pp. 354-356.

A.K. Agarwal, S. Seshadri, and L. B. Rowland, "Temperature Dependence of Fowler-Nordheim Current in 6H-and 4-H-SiC MOS Capacitors." *IEEE Electron Device Letters*, vol. 18, No. 12, Dec. 19997, pp. 592-594.

P. J. Tobin, Y. Okada, S. A. Ajuria, V. Lakhotia, W. A Feil, and R. I. Hedge, "Furnace formation of silicon oxynitride thin dielectrics in nitrous oxide ($N_2O$): The role of nitric oxide (NO)." *Journal of Applied Physics.* vol. 75, No. 3, Feb. 1, 1994, pp. 1811-1817.

Sze, S.M. *Physics of Semiconductor Devices*, John Wiley & Sons, p. 383-390.

H.F. Li, S. Dimitrijev, H.B. Harrison, D. Sweatman, and P.T. Tanner. "Improving $SiO_2$ Grown on P-Type 4H-SiC by NO Annealing." *Materials Science Forum.* vols. 264-268 (1998) pp. 869-872.

K. Ueno, R. Asai, and T. Tsuji. "4H-SiC MOSFET's Utilizing the $H_2$ Surface Cleaning Technique." *IEEE Electron Device Letters*, vol. 19, No. 7, Jul. 1998, pp. 244-246.

Chung et al. "The Effect of Si:C Source Ratio on $SiO_2$/SiC Interface State Density for Nitrogen Doped 4H and 6H-SiC," *Materials Science Forum.* (2000) vols. 338-342, pp. 1097-1100.

Pantelides et al. "Atomic-Scale Engineering of the SiC-$SiO_2$ Interface," *Materials Science Forum.* (2000) vols. 338-342, pp. 1133-1136.

Jamet, et al. "Physical properties of $N_2O$ and NO-nitrided gate oxides grown on 4H SiC," *Apppplied Physics Letters.* vol. 79, No. 3, Jul. 16, 2001, pp. 323-325.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Kobayashi et al. "Dielectric Breakdown and Current Conduction of Oxide/Nitride/Oxide Multi-Layer Structures," *1990 IEEE Symposium on VLSI Technology*. pp. 119-120.

Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.

Das, Mrinal K. Graduate thesis entitled, *Fundamental Studies of the Silicon Carbide MOS Structure*. Purdue University, 1999.

Dimitrijev et al., "Nitridation of Silicon-Dioxide Films Grown on 6H Silicon Carbide", *IEEE Electronic Device Letters*, vol. 18, No. 5, May 5, 1997, pp. 175-177.

De Mao et al., "Thermal Oxidation of SiC in $N_2O$", *J. Electrochem. Soc.*, vol. 141, 1994, pp. L150-L152.

Dahlquist et al. "A 2.8kV, Forward Drop JBS Diode with Low Leakage," *Materials Science Forum*, vols. 338-342, (2000) pp. 1179-1182.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 20002, pp. 562-564.

Motorola Power MOSFET Transistor Databook, 4th edition. Motorola, INc., 1989, pp. 2-5-4-2-5-7.

Ryu et al. Article and Presentation: "27m$\Omega$-cm$_2$, 1.6 kV Power DiMOSFETs in 4H-SiC," *Proceedings of the 14 International Symposium on Power Semiconductor Devices & ICs 2002*, Jun. 4-7, 2002, Santa Fe, NM.

Chung et al. "Effects of anneals in ammonia on the interface trap density near athe band edges in 4H-silicon carbide metal-oxide-semiconductor capacitors," *Applied Physics Letters*. vol. 77, Nov. 27, 2000, pp. 3601-3603.

Williams et al. "Passivation of the 4H-SiC/$SiO_2$ Interface with Nitric Oxide," *Materials Science Forum*. vols. 389-393 (2002), pp. 967-972.

\* cited by examiner

NITROGEN PASSIVATION OF INTERFACE STATES IN SIO₂/SIC STRUCTURES

RELATED APPLICATIONS

The present application is related to and claims priority from U.S. Provisional Application Ser. No. 60/406,753, entitled "Nitrogen Passivation of Interface States in SiO₂/SiC Structures," filed Aug. 30, 2002, the disclosure of which is incorporated herein in its entirety.

STATEMENT OF GOVERNMENT SUPPORT

The present invention was made with Government support under contract number N00014-02-C-0302 awarded by the Office of Naval Research. The Government has certain rights in this invention.

BACKGROUND OF THE INVENTION

Nitrogen passivation, also called "nitridation" is known to be an effective method for reducing the density of interface states at the SiO₂/SiC interface. Nitridation techniques, including growth and post-oxidation annealing are described in detail in U.S. patent publication no. 2002/0102358 published Aug. 1, 2002 entitled "Method Of Fabricating An Oxide Layer On A Silicon Carbide Layer Utilizing An Anneal In A Hydrogen Environment", U.S. patent publication no. 2002/0072247 entitled "Method Of N₂O Growth Of An Oxide Layer On A Silicon Carbide Layer" filed Oct. 1, 2001, and U.S. patent application Ser. No. 09/834,283 filed Apr. 12, 2001 entitled "Method Of N₂O Annealing An Oxide Layer On A Silicon Carbide Layer" each of which commonly is assigned to the assignee of the present invention and each of which is incorporated herein by reference as if set forth fully herein.

Briefly, nitridation processes introduce nitrogen to the SiO₂/SiC interface in sufficient concentrations to passivate or neutralize at least some concentration of "traps" at the interface that would otherwise create unwanted energy states in the layers. "Traps" are localized areas within a semiconductor material that can attract or "trap" free electrical carriers. Traps may be caused by unterminated or dangling electrochemical bonds at the interface of dissimilar materials such as SiO₂ and SiC. Traps may also be produced by other types of lattice defects near the interface. Unwanted energy states may impair the electrical properties of material near the SiO₂/SiC interface and may reduce the performance of electronic devices that incorporate such interfaces, such as MOSFETs, capacitors and other devices. Traps may also impair the electrical functioning of a device by causing field termination and/or Coulomb scattering.

Local nonuniformities at the SiC surface also may result in an uneven distribution of charge near the interface. In typical SiO₂/SiC structures, the uneven distribution of charge may result in a variation in surface potential at the SiC surface having a standard deviation of around 4 kT—a significant fluctuation. In comparison, the surface potential variation in silicon may be less than 1.5 kT. Variation in surface potential may cause undesirable characteristics in electronic devices. For example, variation in surface potential may cause a MOSFET incorporating a SiO₂/SiC interface to have a higher and softer turn-on voltage than would otherwise be the case.

Although nitridation by growth and/or post-oxidation annealing using N₂O and/or NO has been shown to be successful in reducing the density of interface states ($D_{IT}$) in SiO₂/SiC structures while maintaining acceptable oxide strength, experimental results have shown an upper limit on the reduction of $D_{IT}$ that can be achieved through such techniques. Although the precise reason is not known, it is believed that N₂O and NO annealing, while providing nitrogen to passivate the traps, also provides oxygen to the SiO₂/SiC interface which causes the interface to grow further into the SiC, which may create additional traps thereby offsetting the benefits of passivation.

Passivation anneals of SiO₂/SiC interfaces using ammonia (NH₃) as the annealing gas have been investigated by Chung et al. See, e.g. "Effects of anneals in ammonia on the interface trap density near the band edges in 4H-silicon carbide metal-oxide-semiconductor capacitors," Appl. Phys. Let., Vol. 77, No. 22, pp. 3601–03 (November 2000). Chung et al. produced 40 nm oxide layers on 4H—SiC wafers using standard wet oxidation techniques. The wafers were then annealed in NH₃ at a pressure of 1 atm for 2 hours at a temperature between 1050 and 1175° C. Chung et al. found that the interface state density near the conduction band edge was reduced. In "Passivation of the 4H—SiC/SiO₂ interface with Nitric Oxide," Materials Science Forum Vols. 389–393, pp. 967–972 (2002), Chung et al. noted that ammonia appears to be just as effective as NO in reducing the interface state density ($D_{IT}$) near the conduction band edge. However, Chung et al. noted that the breakdown field strength (i.e. the dielectric strength) was found to be much lower for oxide layers passivated with NH₃.

SUMMARY OF THE INVENTION

Nitrogen passivation of interface states in SiO₂/SiC structures is performed, in some embodiments of the present invention, by annealing a silicon dioxide/silicon carbide interface that has been grown and/or nitrided in N₂O and/or NO, in an ambient comprising nitrogen and that is substantially oxygen-free. In some embodiments, the annealing gas is ammonia (NH₃). In some embodiments, a first step of nitridation is performed by growing and/or annealing the oxide layer in an atmosphere containing N₂O and/or NO. Then in a second step, the silicon carbide-oxide interface is nitrided in a substantially oxygen-free environment, in some embodiments using NH₃ as the annealing gas. The first and second nitridation steps may be performed in the same reactor, but are typically performed in different reactors.

In particular embodiments, the annealing is performed at a pressure less than atmospheric pressure and at a temperature greater than about 1000° C. but less than about 1400° C. for a time period sufficient to lower the density of interface states. Some embodiments of the invention can reduce interface state density beyond the levels reported for NO, N₂O or NH₃ nitridation alone without substantially reducing the breakdown field strength of the oxide layer. Some embodiments of the invention also can improve the uniformity of charge distribution in the oxide layer.

In further embodiments of the present invention, a nitrided oxide layer on a silicon carbide layer is processed by annealing the nitrided oxide layer in a substantially oxygen-free nitrogen containing ambient. The anneal may be carried out at a temperature of greater than about 900° C. In further embodiments, the anneal is carried out at a temperature of greater than about 1000° C., for example, a temperature of about 1100° C., a temperature of about 1200° C. or a temperature of about 1300° C.

In still further embodiments of the present invention, annealing the nitrided oxide layer in a substantially oxygen-free nitrogen containing ambient is carried out at a pressure of less than about 1 atmosphere. For example, the nitrided oxide layer may be annealed in a substantially oxygen-free nitrogen containing ambient a pressure of from about 0.01 to about 1 atm. In particular embodiments of the present invention, the nitrided oxide layer is annealed in a substantially oxygen-free nitrogen containing ambient is at a pressure of about 0.2 atm.

In yet additional embodiments of the present invention, the nitrided oxide layer is an oxide layer that is grown in a $N_2O$ and/or NO containing ambient. In other embodiments of the present invention, the nitrided oxide layer is an oxide layer that is annealed in a $N_2O$ and/or NO containing ambient. In yet other embodiments of the present invention, the nitrided oxide layer is an oxide layer that is grown and annealed in a $N_2O$ and/or NO containing ambient.

In further embodiments of the present invention, the substantially oxygen-free nitrogen containing ambient is a $NH_3$ containing ambient. The substantially oxygen-free nitrogen containing ambient may also be $NH_3$ and at least one inert gas. For example, the substantially oxygen-free nitrogen containing ambient may be $NH_3$ and one or more of $N_2$, Ar, and/or He. In particular embodiments of the present invention, the substantially oxygen-free nitrogen containing ambient includes $NH_3$ and $N_2$ in a ratio of about 1:3. Furthermore, the substantially oxygen-free nitrogen containing ambient may include $NH_3$ and $H_2$. The substantially oxygen-free nitrogen containing ambient could also include $NH_3$ and $SiH_4$. In such embodiments, the $SiH_4$ and $NH_3$ may be provided in a reaction chamber containing the nitrided oxide layer such that the $SiH_4$ and $NH_3$ are not mixed until a region of the reaction chamber proximate the nitrided oxide layer.

In certain embodiments of the present invention, a flow rate of the $NH_3$ is from about 1 and about 10 Standard Liters per Minute (SLM). Furthermore, the flow rate of the $NH_3$ may provide a gas velocity of from about 0.1 cm/sec to about 1000 cm/sec. For example, the flow rate of the $NH_3$ may provide a gas velocity of from about 1 cm/sec to about 100 cm/sec.

In still further embodiments of the present invention, the nitrided oxide layer is a thermally grown oxide layer and/or a deposited oxide layer.

DETAILED DESCRIPTION OF PREFERRED EMBODIMENTS

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

According to certain embodiments of the present invention, a SiC substrate on which a $SiO_2$ layer has been grown in a $N_2O$ and/or NO ambient is nitrided in a substantially oxygen-free environment, for example, using $NH_3$ as the annealing gas. Since the annealing gas contains no oxygen, the $SiO_2$ layer does not continue to grow during the nitridation process. A reduction in interface state density ($D_{IT}$) may thereby be obtained without adversely affecting the breakdown field strength of the oxide.

According to additional embodiments of the present invention, a $SiO_2$ layer is grown on a SiC layer using conventional thermal oxide and/or other growth techniques. Then, nitridation using conventional $N_2O$ or NO annealing gas is performed according to conventional techniques. Then, the $SiO_2$/SiC interface is nitrided in a substantially oxygen-free environment, in some embodiments using $NH_3$ as the annealing gas.

As used herein, a substantially oxygen-free environment refers to an environment where an oxygen-containing source gas is not intentionally introduced into a reaction chamber. Thus, the term "substantially oxygen-free" is used to refer to an environment or process that does not intentionally introduce oxygen, although some oxygen may be present.

In particular embodiments, the substantially oxygen-free nitridation, for example, using an $NH_3$ anneal, may be performed at a temperature greater than about 900° C. and in other embodiments at least about 1000° C. In some embodiments, the substantially oxygen-free nitridation anneal is performed at a pressure of 1 atm or less, and in other embodiments at a pressure of about 0.2 atm.

Figure 1:
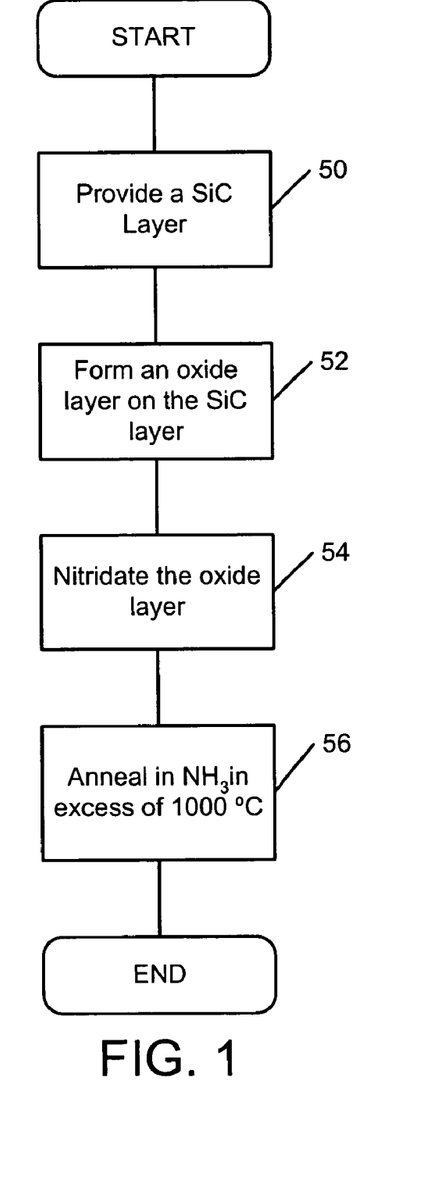
FIG. 1 is a flowchart illustrating operations according to embodiments of the present invention.

Embodiments of the present invention will now be described with reference to FIGS. 1 and 2 that are flowcharts illustrating operations according to particular embodiments of the present invention. As illustrated in FIG. 1, certain embodiments of the present invention utilize a substantially oxygen-free nitridation anneal of an oxide layer to reduce interface state densities at the silicon dioxide/silicon carbide boundary.

Turning to FIG. 1, in block 50 a silicon carbide layer is provided. The silicon carbide layer may comprise a silicon carbide substrate or a silicon carbide epitaxial layer on a substrate. The substrate may be silicon carbide or may be some other material, for example, silicon. In block 52, an oxide layer is provided on the silicon carbide layer. The oxide layer may be grown using conventional wet and/or dry oxidation techniques and/or deposited using CVD techniques, all of which are well known in the art. In block 54, the silicon dioxide/silicon carbide interface is subjected to a post-oxidation anneal in $N_2O$ and/or NO to nitridate the interface. Such an anneal may be carried out as described, for example, in the United States Patent Applications referenced herein. In block 56, the oxide layer on the silicon carbide layer is annealed in an ambient containing nitrogen and substantially no oxygen. The anneal may be carried out at a temperature greater than 900° C. and, in some embodiments, in excess of about 1000° C. for a time sufficient to reduce the interface state density of the silicon dioxide/silicon carbide interface. In some embodiments, the ambient contains $NH_3$.

Figure 2:
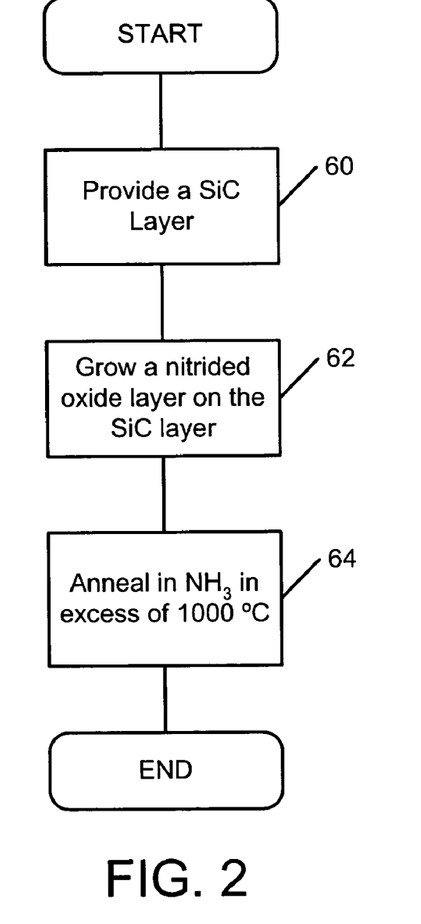
FIG. 2 is a flowchart illustrating operations according to further embodiments of the present invention.

Other embodiments of the invention are illustrated in FIG. 2 in which a SiC layer is provided in block 60. The silicon carbide layer may be a silicon carbide layer as described above with reference to FIG. 1. In block 62, a nitrided oxide layer is grown on the SiC layer. The nitrided oxide layer may be grown in a $N_2O$ and/or a NO ambient. $N_2O$ and/or NO oxide growth may be carried out, for example, as described in the United States Patent Applications referenced herein. In block 64, the silicon dioxide/silicon carbide interface is annealed in an ambient containing nitrogen and substantially no oxygen. The anneal may be carried out at a temperature greater than 900° C. and in some embodiments in excess of about 1000° C. for a time sufficient to reduce the interface state density of the silicon dioxide/silicon carbide interface. In some embodiments, the ambient contains $NH_3$.

Figure 3:
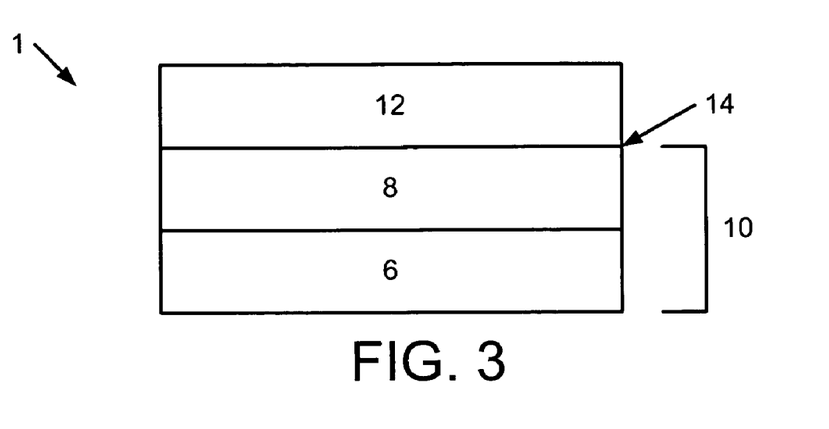
FIG. 3 is schematic diagram of a structure that may be treated according to embodiments of the present invention.

An exemplary structure 1 which may be treated in accordance with embodiments of the present invention is illustrated in FIG. 3, which shows a substrate 10 on which an oxide layer 12 comprising $SiO_2$ has been grown using conventional techniques. Substrate 10 may comprise a silicon carbide substrate 6, a silicon carbide epitaxial layer 8 on a silicon carbide substrate 6, or a silicon carbide epitaxial layer 8 on a non-silicon carbide substrate 6. Structure 1 may be a precursor for the production of various electronic devices, such as MOSFETs, capacitors, and other devices utilizing $SiO_2$ layers on silicon carbide. As discussed above, imperfections and incomplete bonding at the interface 14 between the silicon carbide substrate 10 and the oxide layer 12 can cause "traps" in the structure which may give rise to unwanted electrical states. The density of such unwanted states, $D_{IT}$, may be reduced by passivating (or neutralizing) the traps present in the interface 14.

Figure 4:
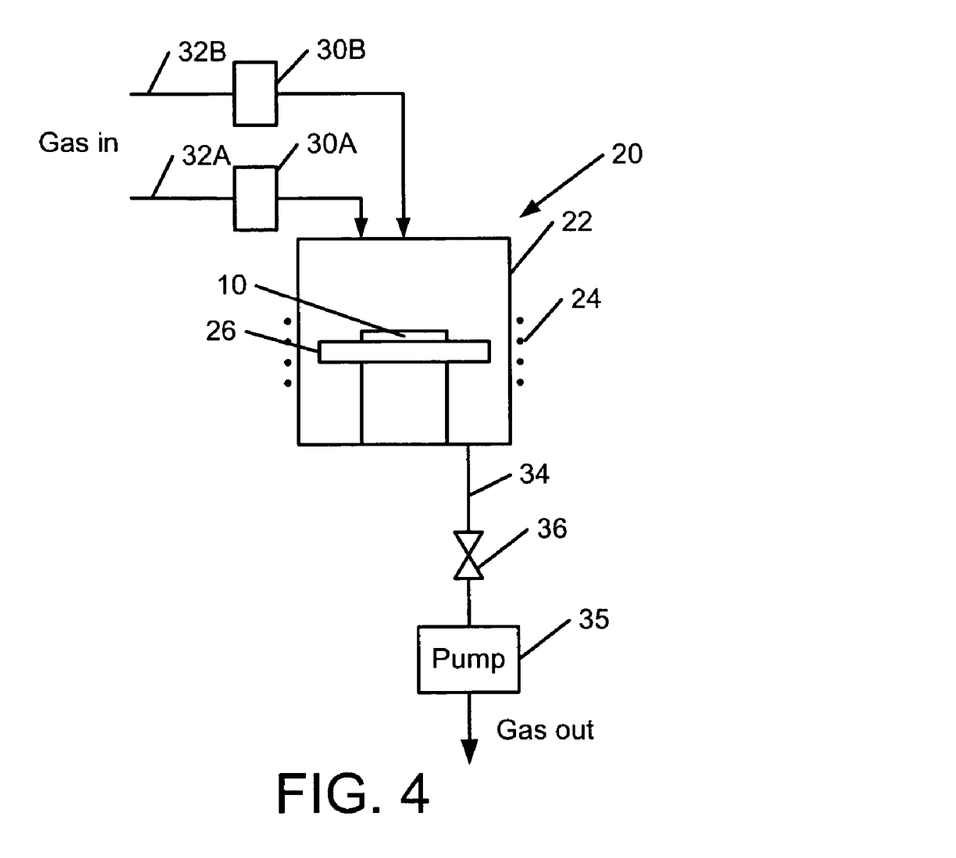
FIG. 4 is a schematic illustration of a reactor suitable for use in embodiments of the present invention.

A schematic illustration of a reactor 20 suitable for use in embodiments of the present invention is illustrated in FIG. 4. As seen in FIG. 4, the reactor 20 includes a chamber 22 in which a susceptor 26 is provided for supporting the substrate 10. An RF induction coil 24 surrounds the chamber 22 and provides RF energy for heating the susceptor 26. Heating may also be accomplished with a resistive heating element. Annealing gas is provided to the chamber through the gas inlets 32A, 32B. Gas is removed from the reactor through a gas outlet 34. The pressure within the chamber 22 is regulated by a vacuum pump 35 and a throttle valve 36. The flow of gas into the reaction chamber 22 is controlled by the mass flow controllers 30A and 30B. In some embodiments, the reactor 20 is capable of producing substrate temperatures in excess of about 1000° C. within the reaction chamber 22.

In accordance with some embodiments of the invention, a silicon carbide substrate 10 is provided on which an oxide layer 12 comprising $SiO_2$ has been grown. The substrate 10 is placed on a susceptor 26 in the reaction chamber 22. The pressure of the reaction chamber is pumped down to about 1 atmosphere or lower. An annealing gas containing nitrogen but not oxygen is introduced to the chamber 22 through gas inlet 32A or 32B, while the pressure in the chamber 22 is maintained below about 1 atm, in some embodiments between about 0.01 and 1 atm, and in other embodiments at about 0.2 atm. In some embodiments, the annealing gas comprises $NH_3$. The $NH_3$ anneal may be performed using an inert carrier gas such as $N_2$, Ar, and/or He or no carrier gas. An inert gas may be used rather than a gas such as $H_2$ that could accelerate a reduction of the thickness of the oxide layer through the formation and removal of gases such as $SiH_4$. Nitrogen may be used in some embodiments as a carrier gas primarily due to its low cost and availability. Preferably, the ratio of $NH_3$ to $N_2$ is about 1:3. In addition, in some embodiments, small amounts of $H_2$, may be present in the chamber 22.

Additionally, $SiH_4$ gas may be flowed through, for example, gas inlet 32A so as to reduce and/or limit thickness reduction, eliminate thickness reduction, or even grow additional $SiO_xN_y$, and/or $SiN_z$ if desired. In some embodiments, the $SiH_4$ and $NH_3$ are not mixed until they are near the substrate 10 to prevent pre-reactions. Thus, for example, $SiH_4$ may be provided through gas inlet 32A and $NH_3$ provided through gas inlet 32B where the gas inlets 32A and 32B are configured to not mix the gases introduced into the chamber 22 until the gases are near the substrate 10. In some embodiments, annealing is performed at a higher temperature and at reduced pressure for stable flow conditions. The annealing system design may be typical of that used for the epitaxial growth of Group III-nitrides. Although typical and specific ranges are provided in this description, it will be understood by those skilled in the art that the exact annealing conditions may vary depending on the system geometry of the reactor and, therefore, may be optimized for a given system geometry. Accordingly, embodiments of the present invention should not be limited to the typical and/or specific process values, parameters and ranges herein.

The $NH_3$ flow rate is dependent upon the particular equipment used, however, in particular embodiments the flow rate is maintained at between about 1 and about 10 Standard Liters per Minute (SLM) during the annealing process. For particular systems, gas velocities as low as about 0.1 cm/sec or as high as about 1000 cm/sec may be suitable, although gas velocities of about 1 cm/sec to about 100 cm/sec also may be used.

The reaction chamber 22 is then heated to a temperature in excess of about 900° C. and, in particular embodiments, in excess of about 1000° C. but less than about 1400° C. to reduce or prevent damage to the oxide layer 12 and maintained at a predetermined temperature profile in excess of about 900° C. and, in particular embodiments, in excess of about 1000° C. In some embodiments, the temperature of the chamber 22 is maintained at about 1000° C. to about 1300° C. during the anneal. The anneal may be carried out for about 30 minutes. However, anneals of from about 5 minutes to about 5 hours or longer may be utilized. The reaction chamber 22 is then allowed to cool to room temperature, and the substrate 10 is removed from the chamber 22. In some embodiments of the present invention, the duration of heat up and/or cool down is included in the anneal time. However, in other embodiments of the present invention, the anneal time is the time at which the oxide layer 12 is at a temperature in excess of about 1000° C. in a nitrogen containing oxygen-free ambient.

In some embodiments, the oxide layer 12 is nitrided using $N_2O$ or NO prior to annealing in an oxygen-free ambient. Nitridation of the oxide layer may be accomplished by growth in an $N_2O$ and/or NO environment and/or post-growth anneal in an $N_2O$ and/or NO environment as described in U.S. patent publication 2002/0102358 referenced above.

NO growth and/or annealing as described above may be utilized alone or in combination with $N_2O$ growth and/or annealing. If the nitrided oxide layer is provided by growth and/or annealing in an $N_2O$ environment, such growth and/or annealing may be carried out at a predetermined temperature and a predetermined flow rate as described herein.

For $N_2O$ annealing, the oxide may be annealed using a predetermined temperature profile which includes an anneal temperature of greater than about 1100° C. in a chamber in which $N_2O$ is supplied at a flow rate profile within predetermined flow rate limits. The temperature of the anneal is about 1175° C. or higher in some embodiments and about 1300° C. may be utilized in other embodiments. The flow rate limits of $N_2O$ may be selected based on the particular equipment in which the process is used. However, in particular embodiments the flow rate limits of $N_2O$ may be as low as about 2 Standard Liters per Minute (SLM) or as high as about 8 SLM. In further embodiments, flow rate limits of from about 3 to about 5 SLM may be used. For particular furnaces, gas velocities as low as about 0.37 cm/sec or as high as about 1.46 cm/sec or velocities of from about 0.55 cm/s to about 0.95 cm/s may be suitable. The $N_2O$ and/or NO anneal may be carried out for about 3 hours, however, anneals of from about 30 minutes to about 6 hours may also be utilized although shorter or longer times may also be utilized.

For $N_2O$ growth, the SiC substrate 10 may be oxidized using a predetermined temperature profile which includes an oxidation temperature of greater than about 1200° C. in a chamber in which $N_2O$ is supplied at a flow rate profile within predetermined flow rate limits. The temperature of the oxidation may be greater than 1200° C., for example, about 1300° C. The flow rate limits of $N_2O$ may be selected based on the particular equipment in which the process is used. However, in particular embodiments, the flow rate limits of $N_2O$ may be as low as about 2 Standard Liters per Minute (SLM) or as high as about 6 SLM or higher. In further embodiments, flow rate limits of from about 3.5 SLM to about 4 SLM may be preferred. Thus, for a particular apparatus, gas velocities as low as about 0.37 cm/sec or as high as about 1.11 cm/sec may be utilized in some embodiments, while velocities of from about 0.65 cm/s to about 0.74 cm/s may be used in other embodiments. The $N_2O$ oxidation may be carried out for an amount of time dependent on the desired thickness of the oxide layer. For example, oxidation times of about 3 hours or greater may be utilized. As used herein, $N_2O$ refers to pure $N_2O$ or $N_2O$ in combination with other oxidizing agents, such as steam, $O_2$, and/or inert gases.

Oxidation in an NO and/or $N_2O$ environment and/or anneals in an NO and/or $N_2O$ environment may be followed by an optional anneal in inert gas or gases, such as argon, hydrogen, and/or $N_2$ or combinations thereof with other gases. Such an anneal may be carried out for about 30 minutes, however, anneals of up to about 3 hours or longer may also be utilized. Such a post nitridation anneal in hydrogen may be carried out as described in U.S. patent application Ser. No. 10/045,542, filed Oct. 26, 2001, entitled "METHOD OF FABRICATING AN OXIDE LAYER ON A SILICON CARBIDE LAYER UTILIZING AN ANNEAL IN A HYDROGEN ENVIRONMENT", the disclosure of which is incorporated herein by reference as if set forth in its entirety.

EXAMPLES

The following examples and experimental results shall be regarded as merely illustrative and shall not be construed as limiting the invention. In a first experiment, 450 Å thick layers of $SiO_2$ were formed on 4H—SiC n-type wafers manufactured by Cree, Inc. by conventional dry oxidation techniques, including re-oxidation according to the process described in U.S. Pat. No. 5,972,801 issued Oct. 26, 1999 which is assigned to the assignee of the present invention and which is incorporated herein by reference as if fully set forth herein. The $SiO_2$/SiC interfaces were then nitrided according to the process described in U.S. patent application Ser. No. 09/834,283 filed Apr. 12, 2001 entitled "Method Of $N_2O$ Annealing An Oxide Layer On A Silicon Carbide Layer" referenced above. Specifically, the interface was annealed in a furnace tube at 1300° C. for 3 hours under an $N_2O$ flow rate of 4 SLM. Subsequently, the wafers were removed from the tube furnace.

$NH_3$ annealing was performed in an annealing chamber capable of being vacuum-pressurized. (For comparison purposes, one wafer was not subjected to $N_2O$ anneal, and one of the $N_2O$-annealed wafers was excluded from the $NH_3$ anneal.)

The annealing chamber was vacuum-pressurized to 0.2 atm and $NH_3$ was introduced to the chamber at a rate of 6 SLM. The temperature of the chamber was elevated to 900° C. and a wafer was annealed. The process was repeated using $NH_3$ anneal temperatures of 1000, 1100 and 1200° C. with anneal times ranging from 30–60 minutes.

Aluminum dots were deposited on the oxide layers to form metal-oxide-semiconductor capacitors (MOS-C) from which the following measurements were taken.

Figure 5:
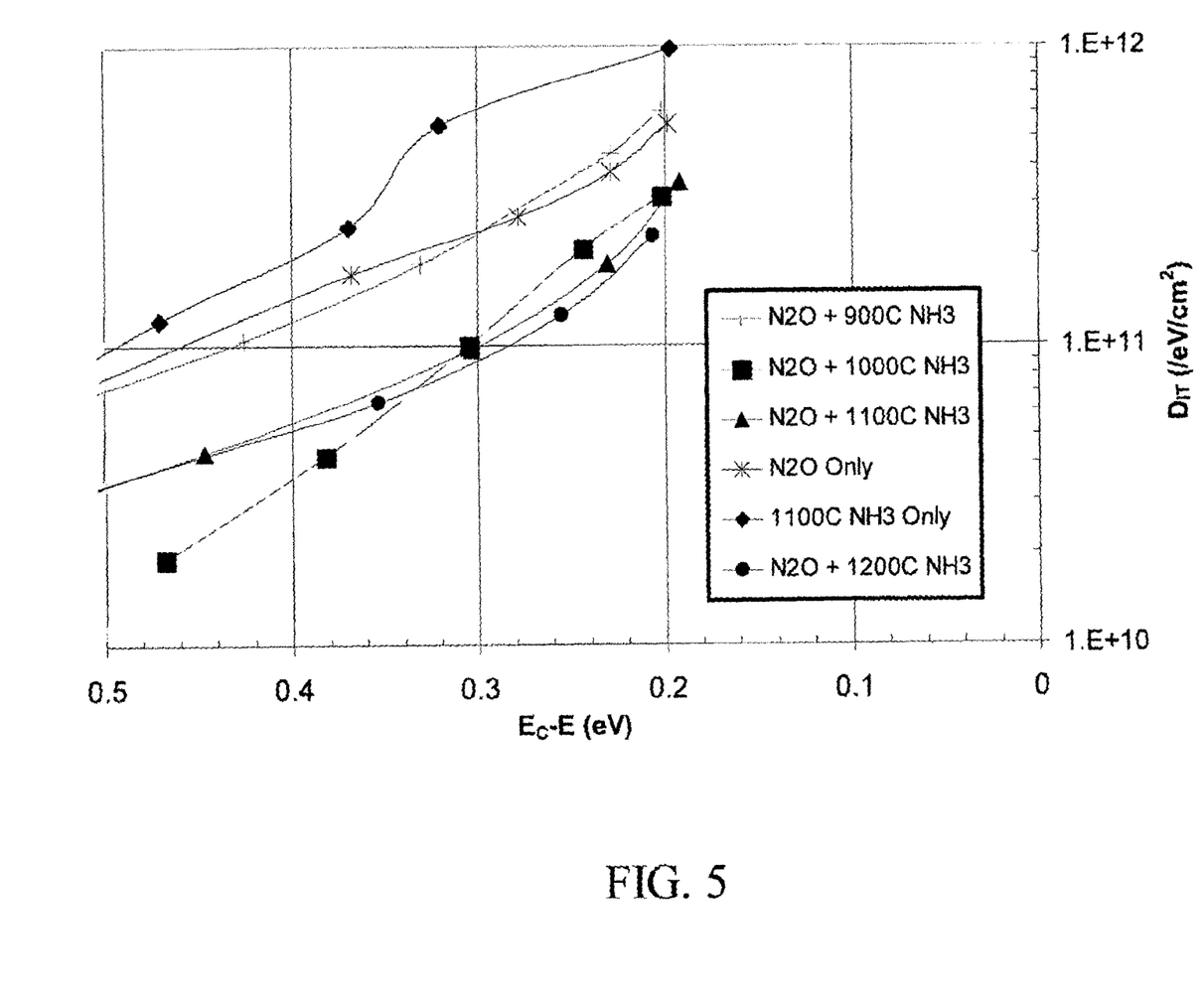
FIG. 5 is a graph illustrating the profile of interface trap density ($D_{IT}$) versus energy level near the conduction band edge of the bandgap at the $SiO_2$/SiC interface for several annealing conditions.

FIG. 5 illustrates the profile of interface trap density ($D_{IT}$) versus energy level near the conduction band edge of the bandgap at the $SiO_2$/SiC interface for several annealing conditions. $D_{IT}$ may be measured using any technique known to those of skill in the art. In this case, the results were obtained using the conductance technique which is well established as a sensitive and accurate measurement of interface state density on MOS structures because it is a direct measurement of signal loss due to trapping and detrapping of interface states.

As shown in FIG. 5, $D_{IT}$ varies exponentially near the band edge. Accordingly, it is common practice to quote $D_{IT}$ values at 0.2 eV from the conduction band ($E_C$–E=0.2 eV) as this point coincides with flatband conditions where the conductance technique begins to lose its accuracy. As illustrated in FIG. 5 the Dry Oxide+$N_2O$ annealed interface yielded a $D_{IT}$ value of approximately 6E11 $eV^{-1}$ $cm^{-2}$ at $E_C$–E=0.2 eV which is comparable to the current state of the art for $N_2O$ and NO nitridation techniques. Following the $N_2O$ anneal with an $NH_3$ anneal at a temperature of up to 900° C. did not show significant improvement to the interface state density. At $NH_3$ anneal temperatures above 900° C., significant reduction of the $D_{IT}$ occurred. A minimum $D_{IT}$ value of approximately 2.3E1 $eV^{-1}$ $cm^{-2}$ was obtained for the Dry Oxide+$N_2O$+1200° C. $NH_3$ annealed interface. As a comparison, a $D_{IT}$ of about 1E12 $eV^{-1}$ $cm^{-2}$ was measured on a Dry Oxide+1100° C. $NH_3$ annealed interface.

Figure 6:
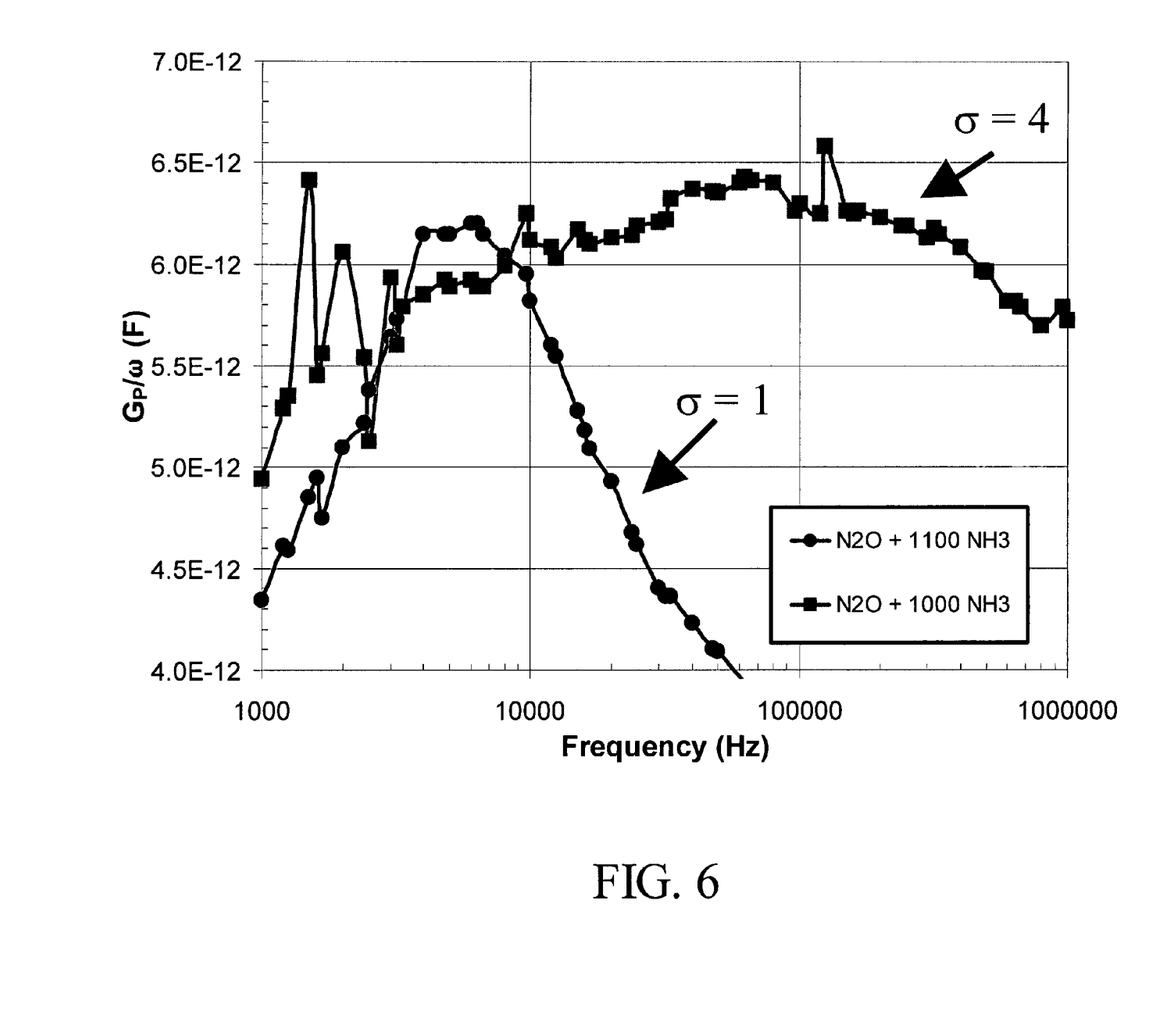
FIG. 6 is a plot of equivalent parallel conductance ($G_P/\omega$) versus frequency for two wafers.

FIG. 6 is a plot of equivalent parallel conductance ($G_p/\omega$) versus frequency for two wafers processed as described above. Both wafers included oxide layers thermally grown using the dry oxide technique, and both wafers were nitrided using an $N_2O$ anneal as described above. One wafer was annealed in $NH_3$ at 1000° C., while the other was annealed in $NH_3$ at 1100° C.

The peak of the Gaussian curve of equivalent parallel conductance is proportional to $D_{IT}$ while the width provides a measure of the standard deviation ($\sigma$) of surface potential fluctuation. As discussed above, the surface potential fluctuates due to local non-uniformities in the oxide and at the interface. This causes the conductance-frequency curve to become wider as adjacent energy levels begin to respond to the signal. Typically, such measurements have yielded very broad curves with $\sigma$=3–4 for SiC MOS-C as is the case with the Dry+$N_2O$+1000° C. $NH_3$ annealed curve. The Dry+$N_2O$+1100° C. $NH_3$ annealed interface shows a much tighter distribution ($\sigma$=1) indicating that this structure has greater charge homogeneity.

Figure 7:
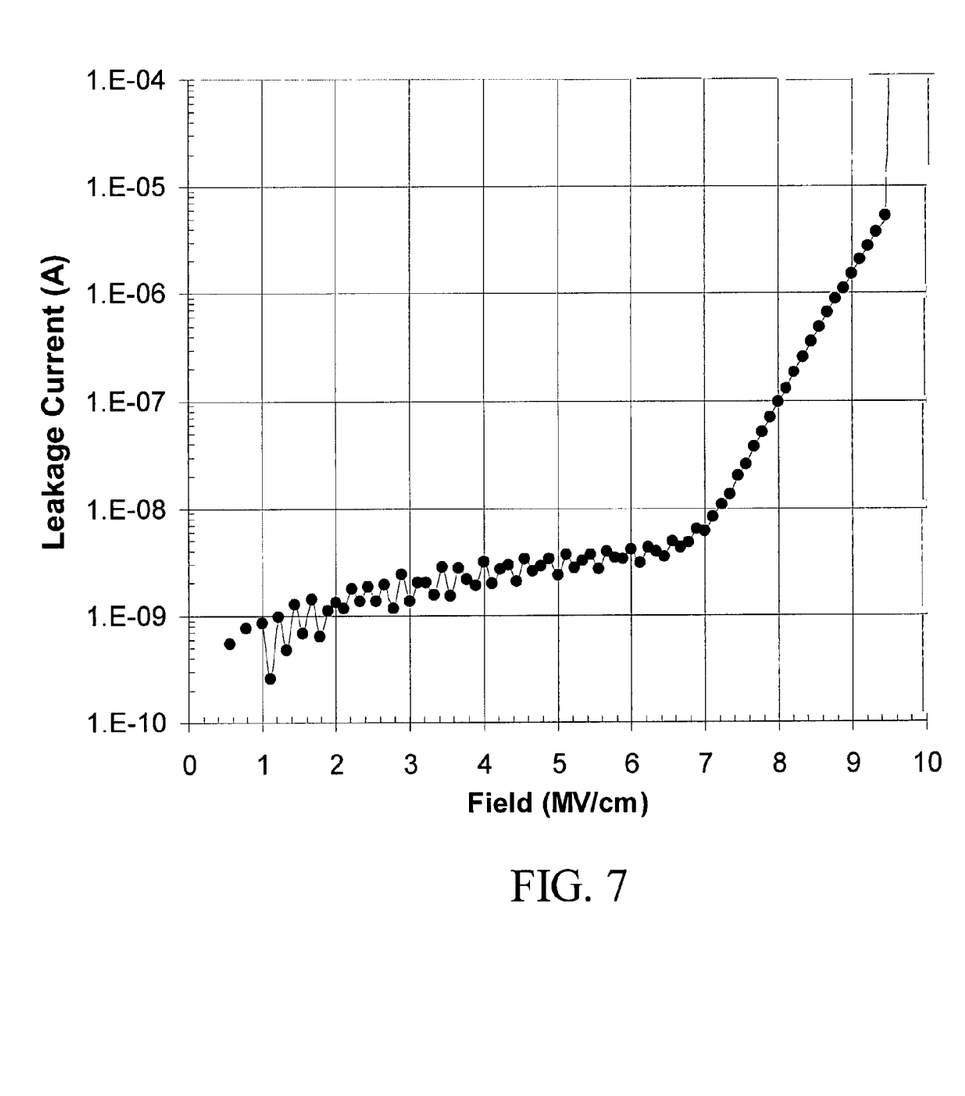
FIG. 7 is a plot of leakage current versus field strength for an oxide processed according to embodiments of the present invention.

One potential drawback of nitridation via $NH_3$ of an oxide that has not previously been nitrided has been the reduced dielectric strength of the oxide layer as noted by Chung et al. Thermally grown silicon dioxide typically has a breakdown field of about 10 MV/cm. Breakdown fields of about 4–5 MV/cm have been observed for $NH_3$ annealed oxides. FIG. 7 shows that the Dry+$N_2O$+1200 $NH_3$ oxide follows a classical Fowler-Nordheim (straight line) characteristic before breaking down at an oxide field of about 9.5 MV/cm, indicating that embodiments of the invention need not deteriorate the dielectric strength of the oxide layer.

Figure 8:
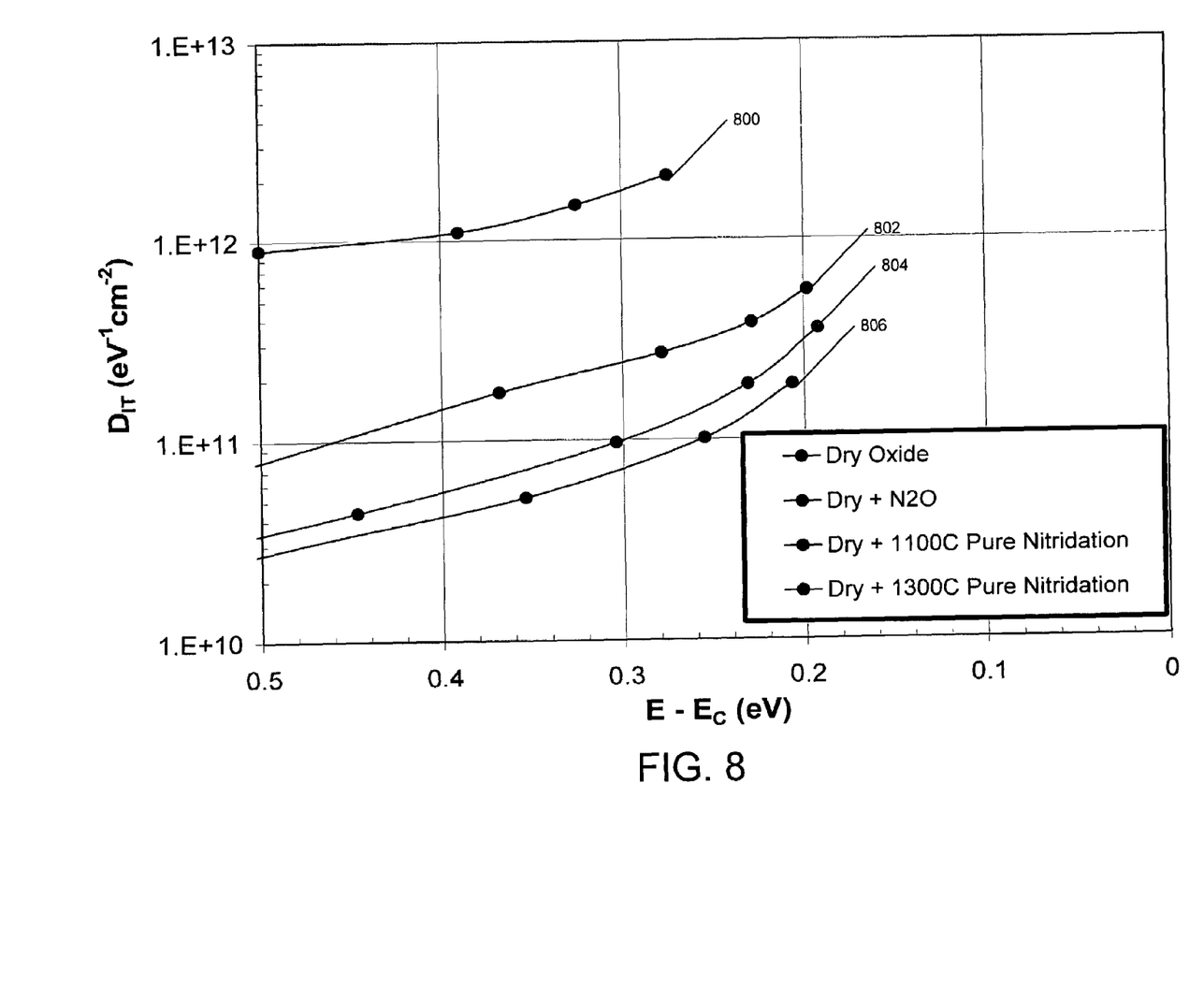
FIG. 8 is a graph illustrating the profile of interface trap density ($D_{IT}$) versus energy level near the conduction band edge of the bandgap at the $SiO_2$/SiC interface for several annealing conditions.

FIG. 8 is a further the profile of interface trap density ($D_{IT}$) versus energy level near the conduction band edge of the bandgap at the $SiO_2$/SiC interface for several annealing conditions. In particular, FIG. 8 illustrates $D_{IT}$ values for a dry oxide 800, for Dry+$N_2O$ 802, for Dry+$N_2O$+1100 $NH_3$ 804 and for Dry+$N_2O$+1300 $NH_3$ 804. As seen in FIG. 8, a $D_{IT}$ value of $1.86E11$ $eV^{-1}$ $cm^{-2}$ was achieved with a 1300° C. $NH_3$ anneal.

Figure 9:
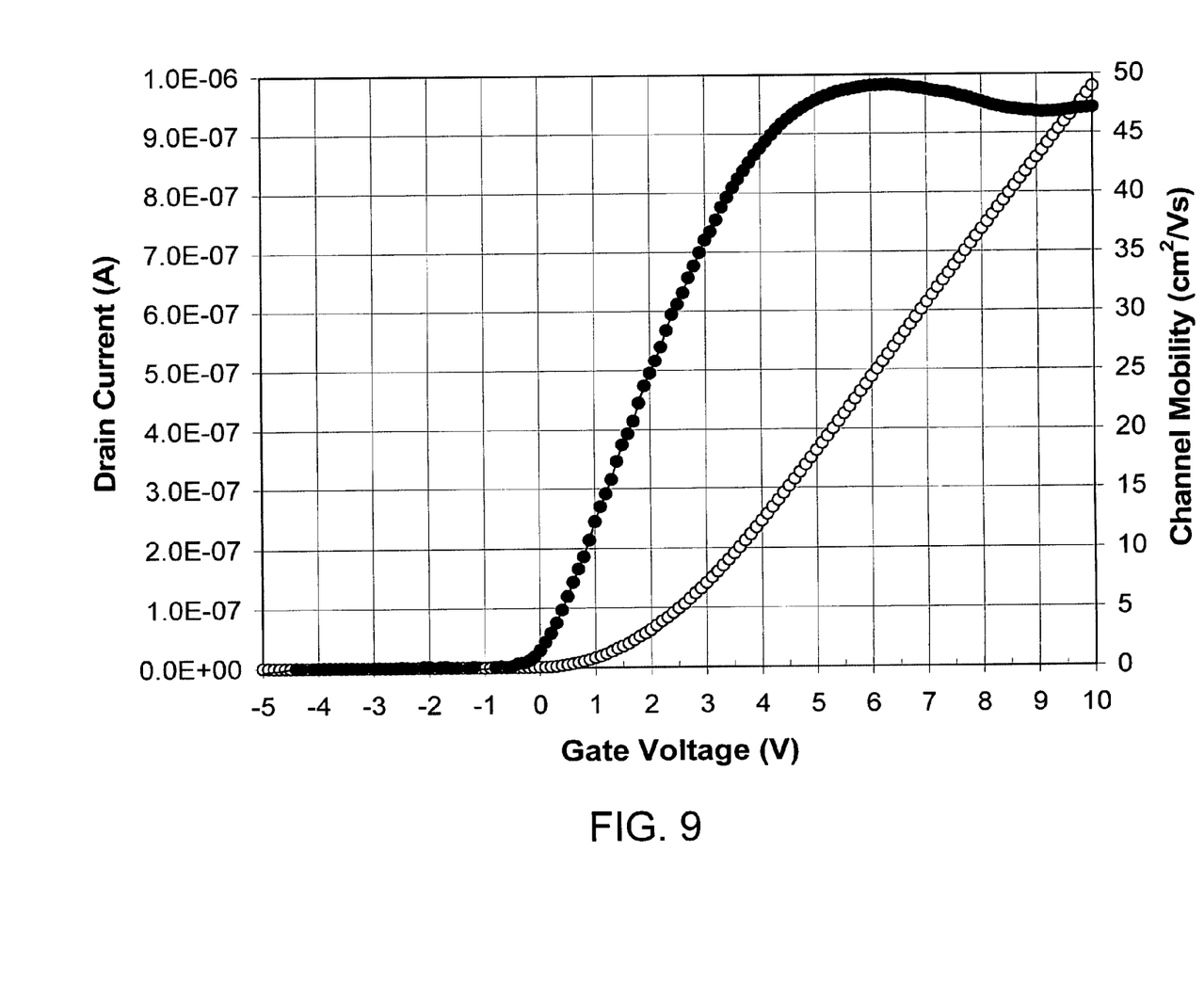
FIGS. 9 and 10 are plots of drain current (the open circle plot) and channel mobility (the filled circle plot) for MOSFETs fabricated using embodiments of the present invention.
Figure 10:
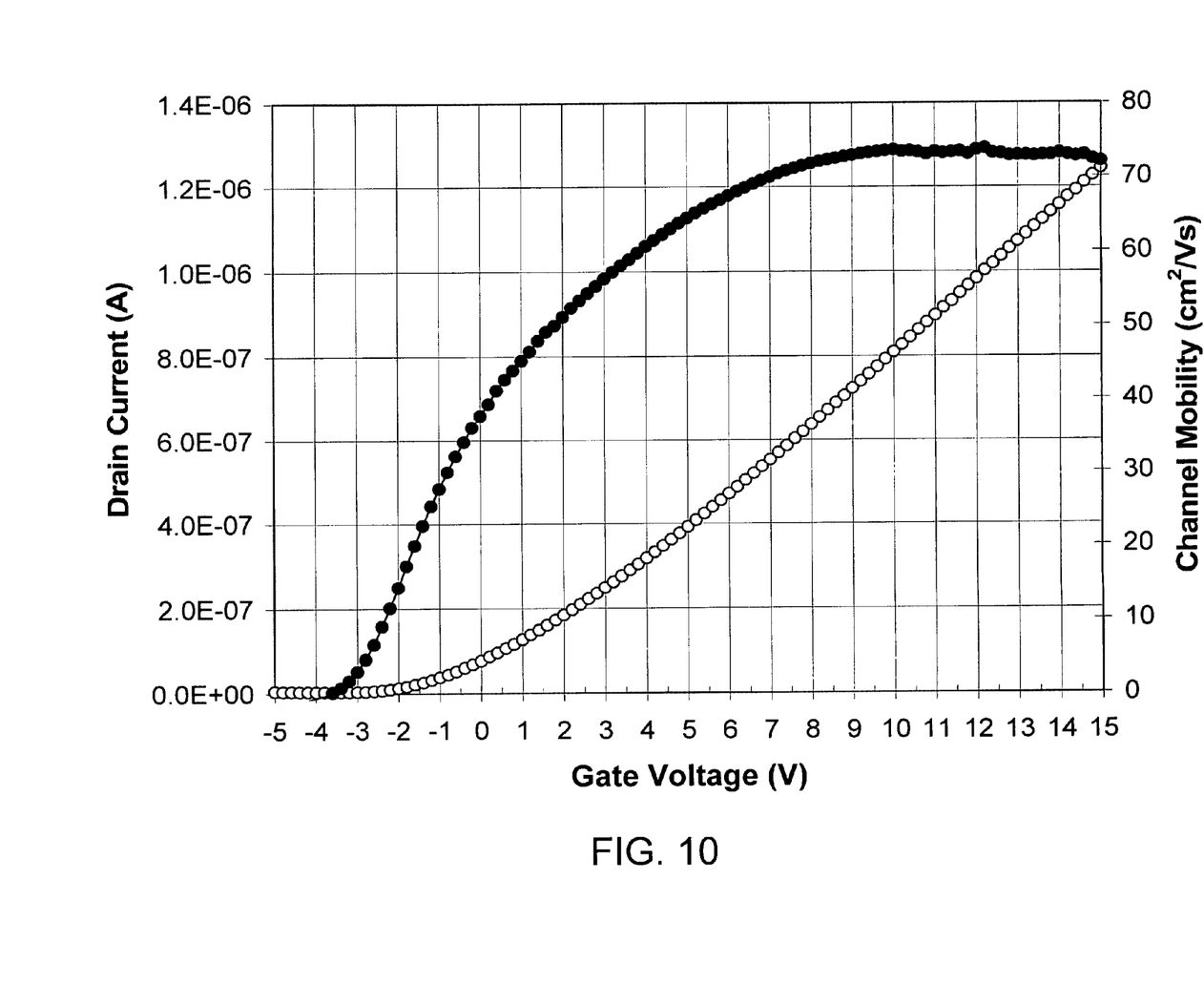

FIGS. 9 and 10 illustrate channel mobility (solid circles) and drain current (open circles) for MOSFETs incorporating gate oxides fabricated according to embodiments of the present invention. FIG. 9 illustrates a dry oxide with a 1300° C. $N_2O$ anneal and a 1300° C. $NH_3$ anneal. For the device of FIG. 9, a threshold voltage $V_T$ of 2 V and a $\mu$=50 $cm^2$/V-s were provided. FIG. 10 illustrates a low temperature oxide (LTO) with a 1300° C. $N_2O$ anneal and a 1300° C. $NH_3$ anneal. For the device of FIG. 10, a threshold voltage $V_T$ of 0.6 V and a $\mu$=73 $cm^2$/V-s were provided. Incorporation of the 1300° C. $NH_3$ anneal has doubled and tripled the channel mobility in thermal and deposited oxide MOSFETs, respectively.

A 1300° C. $NH_3$ anneal following an anneal in NO may provide even further improvements over the 1300° C. $NH_3$ anneal following an $N_2O$ anneal.

In the drawings and specification, there have been disclosed embodiments of the invention, and, although specific terms have been employed, they have been used in a generic and descriptive sense only and not for purposes of limitation.

That which is claimed is:

1. A method of processing a nitrided oxide layer on a silicon carbide layer, the method comprising:
   annealing the nitrided oxide layer in a substantially oxygen-free nitrogen containing ambient, wherein the substantially oxygen-free nitrogen containing ambient comprises a $NH_3$ containing ambient, wherein the substantially oxygen-free nitrogen containing ambient comprises $NH_3$ and $SiH_4$.

2. The method of claim 1, wherein the $SiH_4$ and $NH_3$ are provided in a reaction chamber containing the nitrided oxide layer such that the $SiH_4$ and $NH_3$ are not mixed until a region of the reaction chamber proximate the nitrided oxide layer.

3. The method of claim 1, wherein the nitrided oxide layer comprises a thermally grown oxide layer.

4. The method of claim 1, wherein the nitrided oxide layer comprises a deposited oxide layer.

5. The method of claim 1, wherein annealing the nitrided oxide layer in a substantially oxygen-free nitrogen containing ambient comprises annealing the nitrided oxide layer in a substantially oxygen-free nitrogen containing ambient at a temperature of greater than about 1000° C. and at a pressure of less than 1 atmosphere.

6. The method of claim 1, wherein annealing the nitrided oxide layer in a substantially oxygen-free nitrogen containing ambient is carried out at a temperature of about 1300° C.

* * * * *